(12) United States Patent  
Lin

(10) Patent No.: US 9,247,654 B2
(45) Date of Patent: Jan. 26, 2016

(54) CARRIER SUBSTRATE AND MANUFACTURING METHOD THEREOF

(71) Applicant: Unimicron Technology Corp., Taoyuan (TW)

(72) Inventor: Chun-Ting Lin, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 134 days.

(21) Appl. No.: 13/966,295

(22) Filed: Aug. 14, 2013

(65) Prior Publication Data

US 2014/0332253 A1    Nov. 13, 2014

(30) Foreign Application Priority Data

May 7, 2013    (TW) .............................. 102116226 U

(51) Int. Cl.
| | |
|---|---|
| *H05K 1/11* | (2006.01) |
| *H05K 3/46* | (2006.01) |
| *H05K 3/40* | (2006.01) |
| *H05K 3/00* | (2006.01) |

(52) U.S. Cl.
CPC ............ *H05K 3/4015* (2013.01); *H05K 3/0097* (2013.01); *H05K 3/4644* (2013.01); *H05K 2201/09827* (2013.01); *H05K 2203/041* (2013.01); *H05K 2203/1536* (2013.01)

(58) Field of Classification Search
CPC .......... H01B 5/00; H01R 43/00; H05K 1/112; H05K 3/4688; H05K 3/244; H01L 21/68; H01L 21/44; H01L 21/563; H01L 21/441; H01L 23/52; H01L 23/49811; H01L 23/49816; H01L 23/49822; H01L 24/13; H01L 24/16; H01L 2224/16225; H01L 2224/32225; H01L 2224/48

USPC .......... 29/885; 156/247; 174/126.1, 250, 251, 174/257, 261, 262; 216/11, 13, 20; 257/737, 721, 769, 770, 774, 741; 427/125; 438/614, 667

See application file for complete search history.

(56) References Cited

U.S. PATENT DOCUMENTS

2012/0261828 A1* 10/2012 Bruce et al. .................... 257/774
2012/0312588 A1* 12/2012 Tseng et al. ................... 174/257

FOREIGN PATENT DOCUMENTS

| JP | 2004253761 A * | 9/2004 | ............... H05K 3/42 |
|---|---|---|---|
| JP | 2012-186296 | 9/2012 | |
| TW | 201021182 | 6/2010 | |

OTHER PUBLICATIONS

"Office Action of Taiwan Counterpart Application", issued on Sep. 26, 2014, p. 1-p. 6, in which the listed references were cited.

*Primary Examiner* — Timothy Thompson
*Assistant Examiner* — Guillermo Egoavil
(74) *Attorney, Agent, or Firm* — Jianq Chyun IP Office

(57) ABSTRACT

A carrier substrate includes a dielectric layer, a first circuit layer, an insulation layer, conductive blocks, and a first conductive structure. The dielectric layer has a first surface, a second surface, and blind vias. The first circuit layer is embedded in the first surface and the blind vias extend from the second surface to the first circuit layer. The insulation layer is disposed on the first surface and has a third surface, a fourth surface, and first openings. The first openings expose the first circuit layer and an aperture of each first opening is increased gradually from the third surface to the fourth surface. The conductive blocks fill the first openings and connect with the first circuit layer. The first conductive structure includes conductive vias filling the blind vias and a second circuit layer disposed on a portion of the second surface.

4 Claims, 8 Drawing Sheets

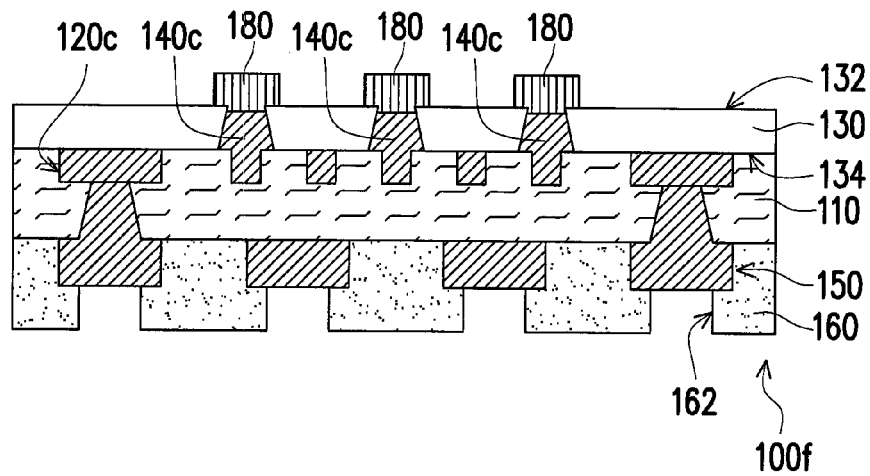
FIG. 4'
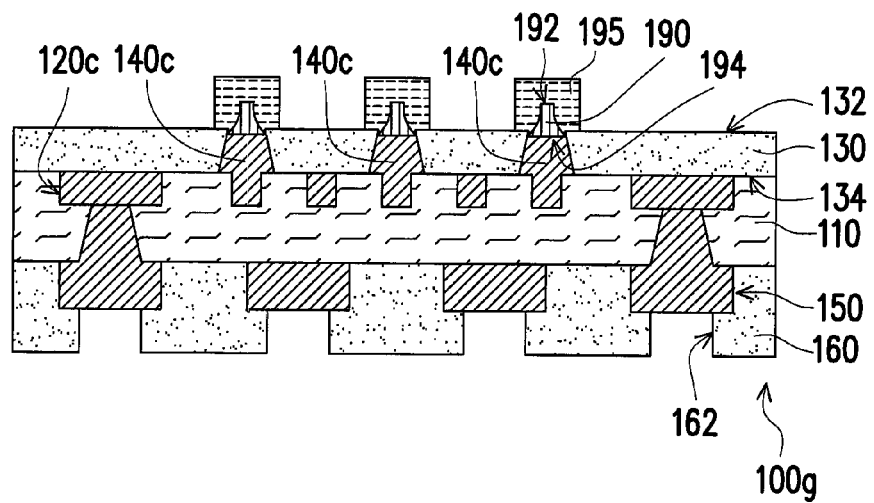
FIG. 4"

CARRIER SUBSTRATE AND MANUFACTURING METHOD THEREOF

CROSS-REFERENCE TO RELATED APPLICATION

This application claims the priority benefit of Taiwan application serial no. 102116226, filed on May 7, 2013. The entirety of the above-mentioned patent application is hereby incorporated by reference herein and made a part of this specification.

BACKGROUND OF THE INVENTION

1. Field of the Invention

The invention relates to a substrate and a manufacturing method thereof, and more particularly, to a carrier substrate suitable for carrying components and a manufacturing method thereof.

2. Description of Related Art

In recent years, with the rapid progress of the electronic technology, high-tech electronic industries have appeared one after another, thus more human-oriented, more performance-preferred electronic products are continuously evolving new things from the old, and have been designed to cater to the trend of being low-profiled and compact-sized. A carrier substrate is usually disposed in the electronic products. The carrier substrate, in addition to having conductive circuits, can also carry components such as capacitors, inductors, resistors, IC chips, or package bodies to be used as data processing units of electronic products.

However, the connection pads and the traces on the known carrier substrate are on the same horizontal plane, and the openings of the solder mask layer expose the connection pads and the traces in the pre-connection region at the same time. Therefore, the arrangements not only affect electrical performance by readily generating oxidation phenomenon to the traces, the user also cannot easily distinguish the connection pads from the traces, and therefore the component cannot be directly connected with the connection pads accurately. Therefore, effectively allowing the user to directly connect the component to the connection pads and preventing the traces from being exposed from the outside of the solder mask layer are one of the goals industries today are actively working toward.

SUMMARY OF THE INVENTION

The invention provides a carrier substrate and a manufacturing method thereof. The carrier substrate can allow the user to easily distinguish connection pads for components and can prevent the generation of oxidation phenomenon from exposed traces.

The carrier substrate of the invention includes a dielectric layer, a first circuit layer, an insulation layer, a plurality of conductive blocks, and a first conductive structure. The dielectric layer has a first surface and a second surface opposite to each other and a plurality of blind vias. The first circuit layer is embedded in the first surface of the dielectric layer and has an upper surface and a lower surface opposite to each other. The upper surface is exposed from the first surface of the dielectric layer. The blind vias extend from the second surface to the first circuit layer and expose a portion of the lower surface of the first circuit layer. The insulation layer has a third surface and a fourth surface opposite to each other. The insulation layer is disposed on the first surface of the dielectric layer through the fourth surface, and covers a portion of the upper surface of the first circuit layer. The insulation layer has a plurality of first openings extending from the third surface to the fourth surface. The first openings expose another portion of the upper surface of the first circuit layer and the aperture of each first opening is increased gradually from the third surface to the fourth surface. Moreover, the apertures of the first openings on the fourth surface are greater than the width of the exposed first circuit layer. The conductive blocks are respectively disposed in the first openings of the insulation layer and connected with another portion of the upper surface of the first circuit layer exposed by the first openings. The first conductive structure is disposed on the second surface of the dielectric layer and includes a plurality of conductive vias filling the blind vias and a second circuit layer disposed on a portion of the second surface.

In an embodiment of the invention, the carrier substrate further includes a built-up structure. The built-up structure is disposed on the second surface of the second circuit layer and the dielectric layer. The built-up structure includes at least one built-up dielectric layer and a second conductive structure disposed on the built-up dielectric layer, wherein the second conductive structure at least includes a plurality of second conductive vias disposed in the built-up dielectric layer and a built-up circuit layer disposed on a portion of the built-up dielectric layer, and a portion of the second conductive vias connect with the second circuit layer.

In an embodiment of the invention, the carrier substrate further includes a plurality of conductive bumps disposed corresponding to the first openings of the insulation layer and respectively connecting with the conductive blocks.

In an embodiment of the invention, the carrier substrate further includes a plurality of conductive towers respectively disposed on the conductive blocks, wherein each conductive tower has a tip face and a base face opposite to each other and the diameter of each conductive tower is increased gradually from the tip face to the base face.

The manufacturing method of the carrier substrate of the invention includes the following steps. A first copper foil structure and a second copper foil structure are laminated correspondingly on a first surface and a second surface of a core dielectric layer opposite to each other. Two insulation layers respectively having a third surface and a fourth surface opposite to each other are provided. The insulation layers are respectively laminated on the first copper foil structure and the second copper foil structure by the third surfaces, wherein each insulation layer has a plurality of first openings extending from the third surface to the fourth surface and the aperture of each first opening is increased gradually from the third surface to the fourth surface. A first circuit layer is respectively formed on a portion of the fourth surfaces of the insulation layers, and a plurality of conductive blocks fills the first openings. A dielectric layer is respectively laminated on another portion of the fourth surfaces of the insulation layers and the first circuit layers, wherein the dielectric layers have a plurality of blind vias extending to a portion of the first circuit layers. A first conductive structure is respectively formed on the dielectric layers, the first conductive structures includes a plurality of conductive vias filling the blind vias and a second circuit layer disposed on a portion of the dielectric layers. The first copper foil structure, the second copper foil structure, and the core dielectric layer are removed to expose the third surfaces of the insulation layers and the conductive blocks.

In an embodiment of the invention, the first copper foil structure includes a first thin copper foil layer, a first release layer, and a first thick copper foil layer. The first release layer is between the first thin copper foil layer and the first thick copper foil layer. The second copper foil structure includes a second thin copper foil layer, a second release layer, and a second thick copper foil layer. The second release layer is between the second thin copper foil layer and the second thick copper foil layer. The first thick copper foil layer and the second thick copper foil layer are disposed correspondingly on the first surface and the second surface of the core dielectric layer.

In an embodiment of the invention, the step of removing the first copper foil structure, the second copper foil structure, and the core dielectric layer to expose the third surfaces of the insulation layers and the conductive blocks includes peeling the first release layer and the second release layer to separate the first thin copper foil layer and the second thin copper foil layer from the core dielectric layer, the first thick copper foil layer, and the second thick copper foil layer, and etching the first thin copper foil layer and the second thin copper foil layer to expose the third surfaces of the insulation layers and the conductive blocks.

In an embodiment of the invention, after removing the first copper foil structure, the second copper foil structure, and the core dielectric layer, a plurality of conductive bumps are respectively formed on the conductive blocks, wherein the conductive bumps respectively connect with the conductive blocks.

In an embodiment of the invention, after removing the first copper foil structure, the second copper foil structure, and the core dielectric layer, a plurality of conductive towers are respectively formed on the conductive blocks. Each conductive tower has a tip face and a base face opposite to each other and the diameter of each conductive tower is increased from the tip face to the base face.

In embodiment of the invention, the manufacturing method of the carrier substrate further includes, before removing the first copper foil structure, the second copper foil structure, and the core dielectric layer, respectively forming a built-up structure on the second circuit layer and the dielectric layers. The built-up structure includes at least one built-up dielectric layer and a second conductive structure formed on the built-up dielectric layer, wherein the second conductive structure at least includes a plurality of second conductive vias formed in the built-up dielectric layer and a built-up circuit layer formed on a portion of the built-up dielectric layer, and a portion of the second conductive vias connect with the second circuit layer.

Based on the above, the first openings of the insulation layer of the invention expose a portion of the first circuit layer and the conductive blocks are disposed on the first circuit layer exposed by the first openings. As a result, the conductive blocks can be used as a structure for elevating a portion of the first circuit layer. At the same time, the conductive blocks can be viewed as bonding pads for components. In this way, in subsequent applications of the carrier substrate of the invention in carrying components (such as capacitors, inductors, resistors, IC chips, or package), the component can be accurately connected with the conductive blocks to increase the reliability of bonding between the carrier substrate and the component. Moreover, the insulation layer covers another portion of the first circuit layer, which can protect the first circuit layer to prevent the generation of oxidation phenomenon so as to maintain the electrical performance of the first circuit layer.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3F' illustrates a cross-sectional schematic diagram of a carrier substrate of an embodiment of the invention.

FIG. 4' illustrates a cross-sectional schematic diagram of a carrier substrate of another embodiment of the invention.

FIG. 4" illustrates a cross-sectional schematic diagram of a carrier substrate of yet another embodiment of the invention.

DESCRIPTION OF THE EMBODIMENTS

Figure 1A:
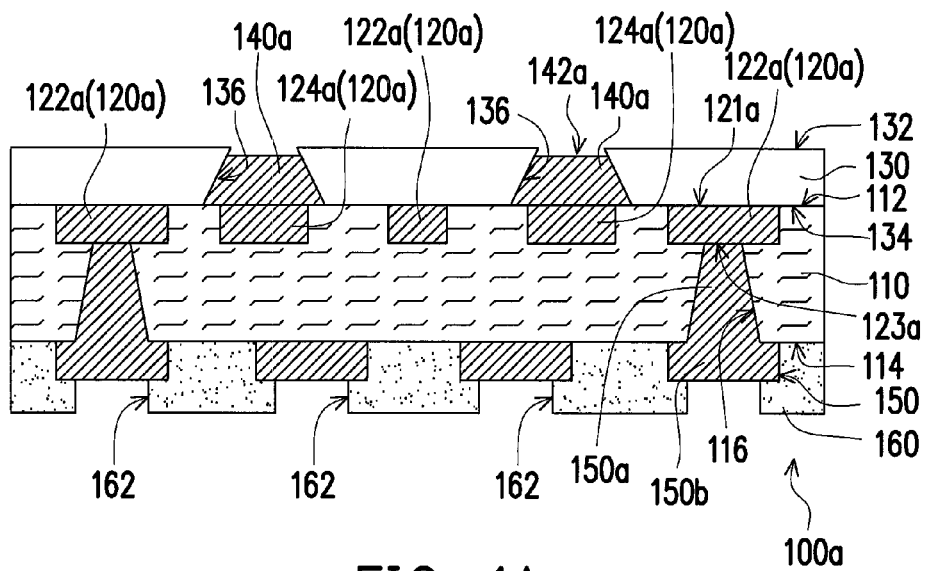
FIG. 1A illustrates a cross-sectional schematic diagram of a carrier substrate of an embodiment of the invention.
Figure 1B:
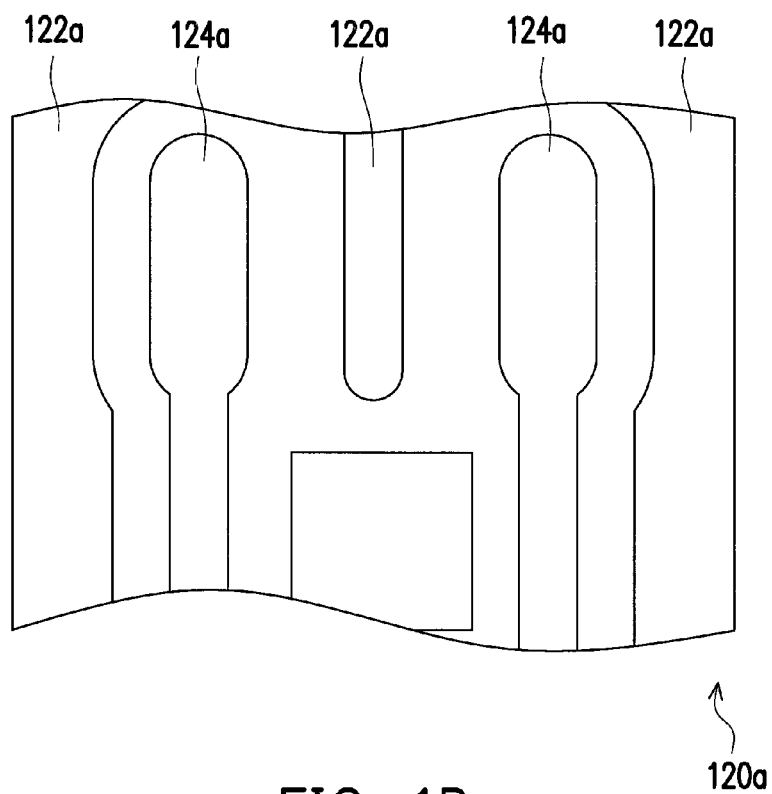
FIG. 1B illustrates a schematic top view of the circuit layer of FIG. 1A.

FIG. 1A illustrates a cross-sectional schematic diagram of a carrier substrate of an embodiment of the invention. FIG. 1B illustrates a schematic top view of the circuit layer of FIG. 1A. Referring first to FIG. 1A, in the present embodiment, a carrier substrate 100a includes a dielectric layer 110, a first circuit layer 120a, an insulation layer 130, a plurality of conductive blocks 140a, and a first conductive structure 150. Specifically, the dielectric layer 110 has two opposing surfaces 112 and 114 and a plurality of blind vias 116 (FIG. 1A schematically illustrates two). The first circuit layer 120a is embedded in the surface 112 of the dielectric layer 110 and has two opposing surfaces 121a and 123a, wherein the surface 121a is exposed from the surface 112 of the dielectric layer 110. The blind vias 116 extend from the surface 114 to the first circuit layer 120a and expose a portion of the surface 123a of the first circuit layer 120a. The insulation layer 130 has two opposing surfaces 132 and 134, is disposed on the surface 112 of the dielectric layer 110 through the surface 134, and covers a portion of the surface 121a of the first circuit layer 120a. The insulation layer 130 has a plurality of first openings 136 extending from the surface 132 to the surface 134. The first openings 136 expose another portion of the surface 121a of the first circuit layer 120a, the aperture of each first opening 136 is increased gradually from the surface 132 to the surface 134, and the apertures of the first openings 136 on the surface 134 are greater than the width of the exposed first circuit layer 120a. The conductive blocks 140a are respectively disposed in the first openings 136 of the insulation layer 130 and connected with another portion of the surface 121a of the first circuit layer 120a exposed by the first openings 136. The first conductive structure 150 is disposed on the surface 114 of the dielectric layer 110. The conductive structure 150 includes conductive vias 150a filling the blind vias 116 and a second circuit layer 150b disposed on a portion of the surface 114. Moreover, the carrier substrate 100a of the present embodiment can further include a solder mask layer 160, wherein the solder mask layer 160 is disposed on another portion of the surface 114 of the dielectric layer 110 and covers a portion of the second circuit layer 150b of the first conductive structure 150, wherein the solder mask layer 160 has a plurality of second openings 162 exposing another portion of the second circuit layer 150b.

More specifically, referring to both FIG. 1A and FIG. 1B, the first circuit layer 120a of the present embodiment includes a plurality of traces 122a and a plurality of connection pads 124a, wherein the first openings 136 expose a portion of the connection pads 124a. In other words, the traces 122a are covered by the insulation layer 130, which can prevent generation of oxidation phenomenon due to the traces 122a being exposed from the outside, thus maintaining the electrical performance of the traces 122a. As shown in FIG. 1A, the surface 121a of the first circuit layer 120a of the present embodiment is substantially exposed from the surface 112 of the dielectric layer 110 and the conductive blocks 140a fill the first openings 136 and directly connect with the connection pads 124a structurally and electrically, wherein the first circuit layer 120a and the conductive blocks 140a can be an integral structure. In this way, the conductive blocks 140a can be viewed as an elevating structure of the connection pads 124a. As a result, in subsequent applications of the carrier substrate 100a of the present embodiment in carrying components (such as capacitors, inductors, resistors, IC chips, or package) (not illustrated), the component can be accurately connected with the conductive blocks 136 to increase the reliability of bonding between the carrier substrate 100a and the component. Moreover, one surface 142a of the conductive blocks 140a of the present embodiment is substantially lower than or level with (not illustrated) the surface 132 of the insulation layer 130 and the sectional shape of the conductive blocks 140a is, for instance, a trapezoid, but is not limited thereto.

It should be mentioned here that, the same reference numerals as the previous embodiment and part of the contents thereof are used in the following embodiments, wherein the same numerals are used to represent the same or similar components and descriptions of the same technical contents are omitted. The omitted portion is described in the previous embodiment and is not repeated in the following embodiments.

Figure 2A:
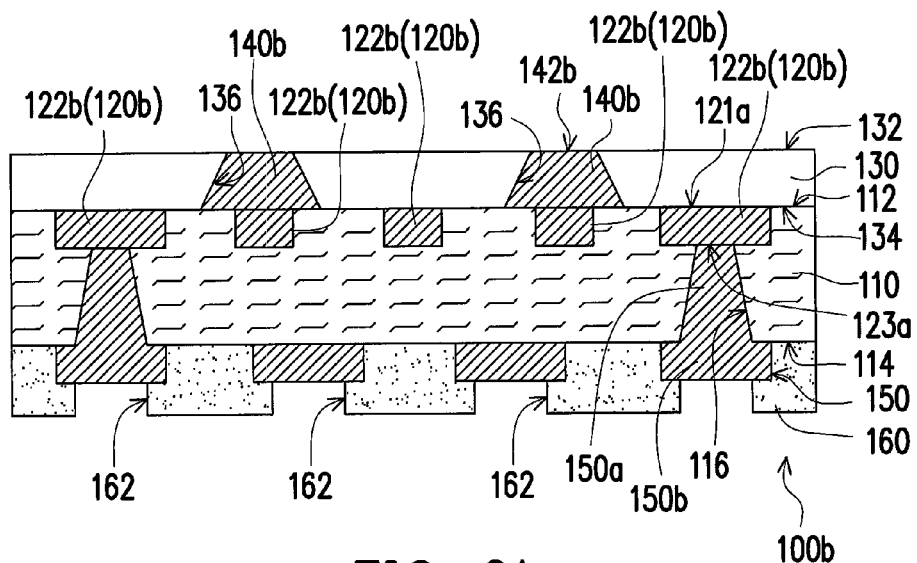
FIG. 2A illustrates a cross-sectional schematic diagram of a carrier substrate of another embodiment of the invention.
Figure 2B:
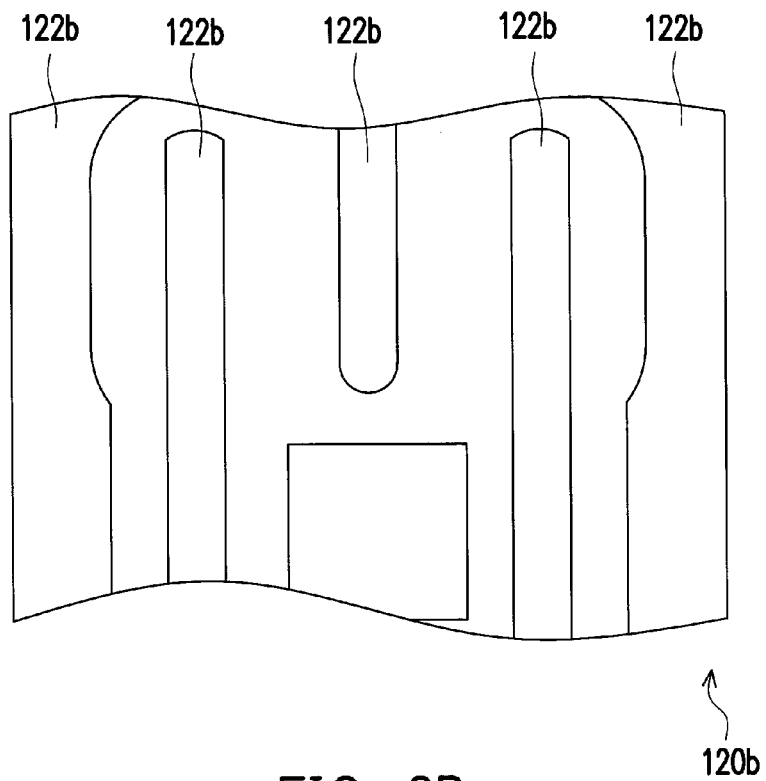
FIG. 2B illustrates a schematic top view of the circuit layer of FIG. 2A.

FIG. 2A illustrates a cross-sectional schematic diagram of a carrier substrate of another embodiment of the invention. FIG. 2B illustrates a schematic top view of the circuit layer of FIG. 2A. Referring to both FIG. 2A and FIG. 2B, the carrier substrate 100b of the present embodiment is similar to the carrier substrate 100a of FIG. 1A, with the difference being that the first circuit layer 120b of the present embodiment is only composed of a plurality of traces 122b and a portion of the traces 122b exposed by the first openings 136 can be used as connection pads. Moreover, the surface 142b of the conductive blocks 140b of the present embodiment is substantially level with or lower than (not illustrated) the surface 132 of the insulation layer 130.

In the following, an embodiment and FIG. 3A to FIG. 3F are used to describe the manufacturing method of the carrier substrate 100c in detail.

Figure 3A:
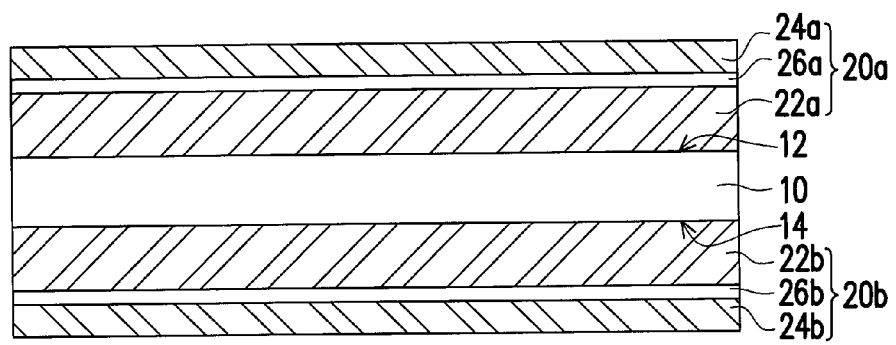
FIG. 3A to FIG. 3F illustrate cross-sectional schematic diagrams of a manufacturing method of a carrier substrate of an embodiment of the invention.

FIG. 3A to FIG. 3F illustrate cross-sectional schematic diagrams of a manufacturing method of a carrier substrate of an embodiment of the invention. Referring first to FIG. 3A, according to the manufacturing method of the carrier substrate 100a of the present embodiment, first, a first copper foil structure 20a and a second copper foil structure 20b are laminated on two opposing surfaces 12 and 14 of a core dielectric layer 10. Specifically, the first copper foil structure 20a of the present embodiment includes a first thick copper foil layer 22a, a first thin copper foil layer 24a, and a first release layer 26a. The first release layer 26a is between the first thin copper foil layer 24a and the first thick copper foil layer 22a. The second copper foil structure 20b includes a second thick copper foil layer 22b, a second thin copper foil layer 24b, and a second release layer 26b. The second release layer 26b is between the second thin copper foil layer 24b and the second thick copper foil layer 22b. The first thick copper foil layer 22a and the second thick copper foil layer 22b are disposed correspondingly on the surfaces 12 and 14 of the core dielectric layer 10.

Figure 3B:
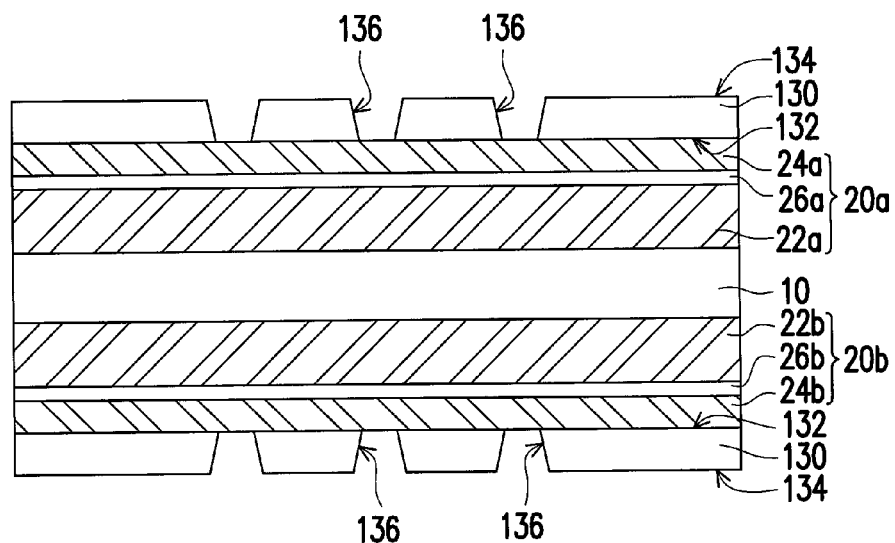

Then, referring to FIG. 3B, two insulation layers 130 respectively having two opposing surfaces 132 and 134 are provided, and the insulation layers 130 are respectively laminated on the first copper foil structure 20a and the second copper foil structure 20b by the surfaces 132, wherein the insulation layers 130 have a plurality of first openings 136 extending from the surfaces 134 to the surfaces 132. In particular, the apertures of the first openings 136 are increased gradually from the surfaces 132 to the surfaces 134. Here, the material of the insulation layers 130 is, for instance, ABF (Ajinomoto build-up film) resin, and the insulation layers 130 are stacked on the first copper foil structure 20a and the second copper foil structure 20b through a method of thermocompression bonding. Moreover, the first openings 136 are, for instance, formed by laser drilling.

Figure 3C:
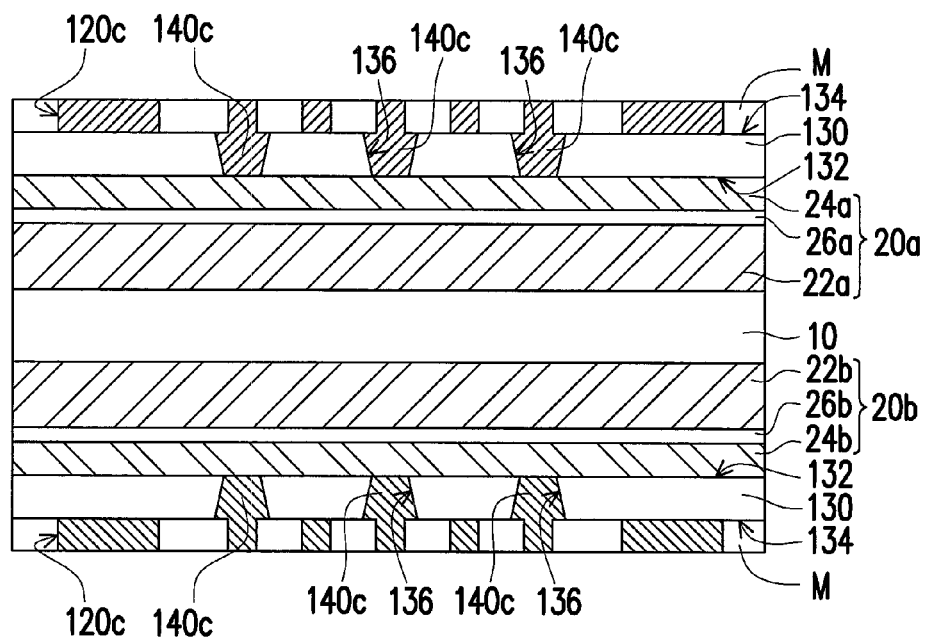

Then, referring to FIG. 3C, a first circuit layer 120c is respectively formed on a portion of the surfaces 134 of the insulation layers 130 and a plurality of conductive blocks 140c fill the first openings 136. Specifically, in the present embodiment, the step of forming the first circuit layers 120c and the conductive blocks 140c includes comprehensively forming a seed layer (not illustrated) on the surfaces 134 of the insulation layers 130 and the surfaces of the first openings 136 and forming a patterned dry film M on the surfaces 134 of the insulation layers 130, wherein the patterned dry film M exposes a portion of the surfaces 134 of the insulation layers 130. Then, an electroplating process is performed to form the first circuit layers 120c on the surfaces 134 of the insulation layers 130 exposed by the patterned dry film M and the conductive blocks 140c filling the first openings 136. Then, the patterned dry film M is removed. In short, the circuit layers 120c and the conductive blocks 140c are integrally formed.

It should be mentioned that, in the present embodiment, the circuit layers 120c can also be composed of only a plurality of traces or composed of a plurality of traces and a plurality of connection pads, wherein the first openings 136 can expose a portion of the traces to be used as connection pads or directly expose a portion of the connection pads. In other words, the traces not used as connection pads are covered by the insulation layers 130, which can prevent the generation of oxidation phenomenon due to the traces being exposed from the outside, thus maintaining the electrical performance of the traces. Moreover, the traces or connection pads exposed by the first openings 136 can be directly connected with the conductive blocks 140c structurally and electrically.

Figure 3D:
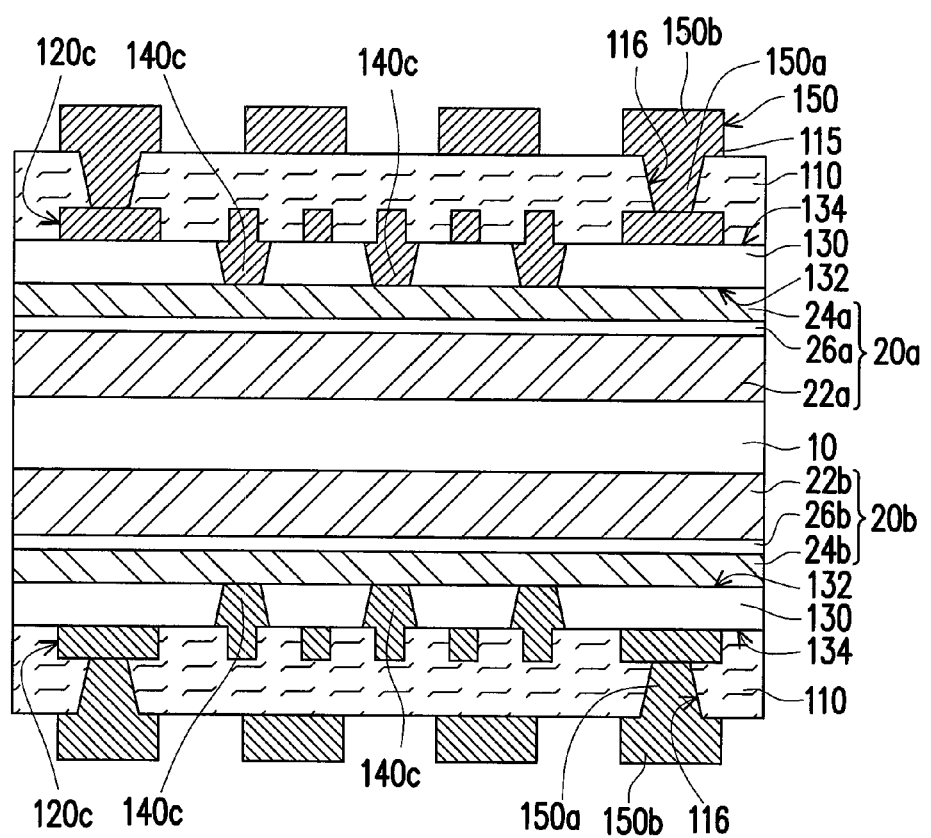

Then, referring to FIG. 3D, a dielectric layer 110 is respectively laminated on another portion of the surfaces 134 of the insulation layers 130 and the first circuit layers 120c, wherein the dielectric layers 110 have a plurality of blind vias 116 extending to a portion of the first circuit layers 120c. Then, referring further to FIG. 3D, a first conductive structure 150 is respectively formed on the dielectric layers 110, wherein the first conductive structures 150 include a plurality of conductive vias 150a filling the blind vias 116 and a plurality of second circuit layers 150b disposed on a portion of the dielectric layers 110.

Figure 3E:
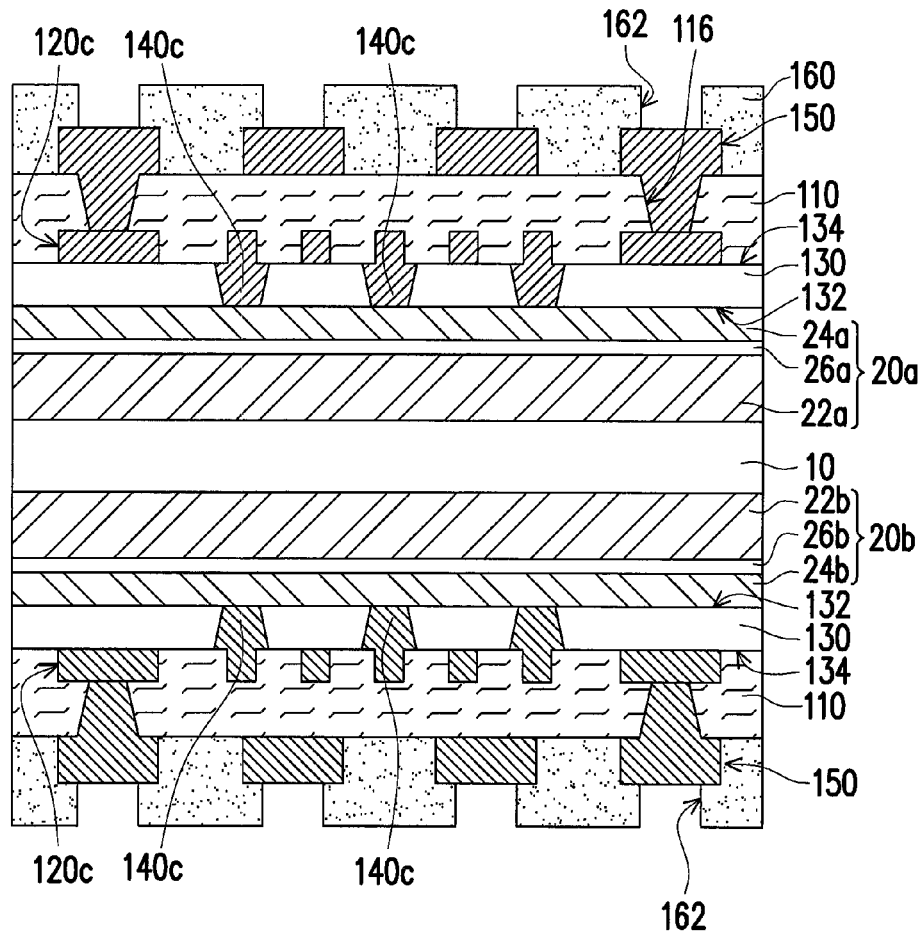

Then, referring to FIG. 3E, a solder mask layer 160 is respectively formed on another portion of the dielectric layers 110 and cover a portion of the first conductive structures 150, wherein the solder mask layers 160 have a plurality of second openings 162 exposing another portion of the first conductive structure 150.

Figure 3F:
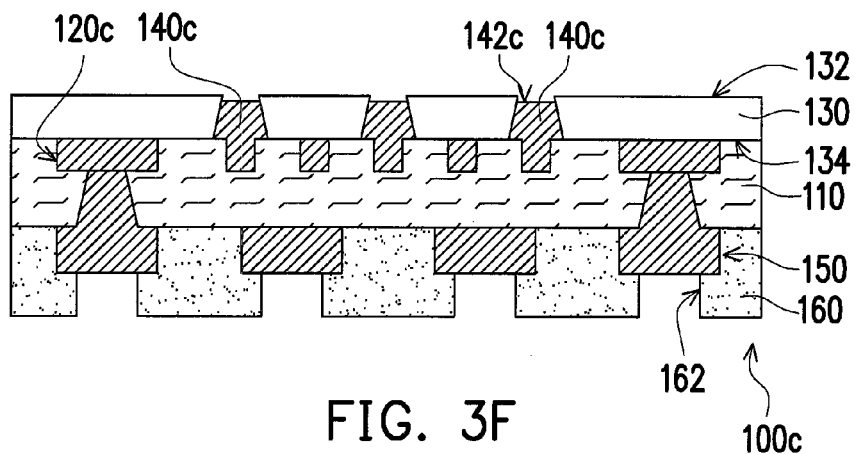
Figure 3F:
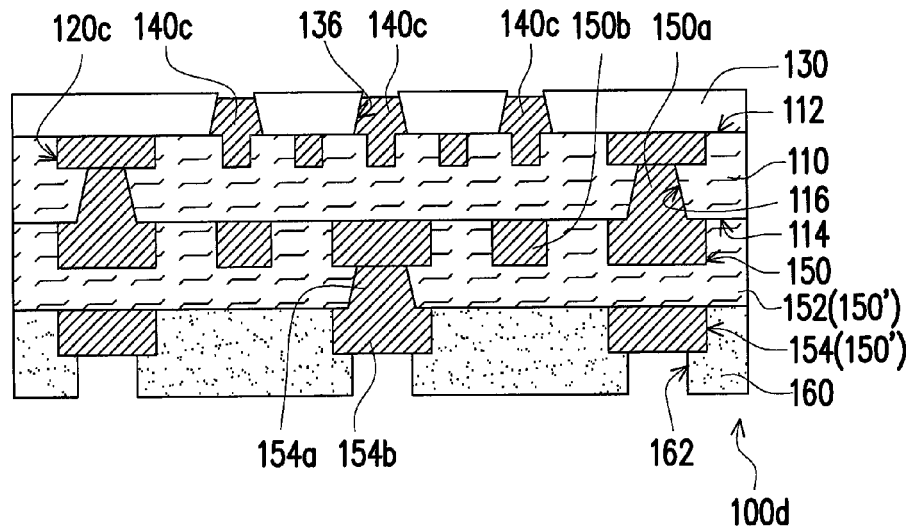

Lastly, referring to both FIG. 3E and FIG. 3F, the first copper foil structure 20a, the second copper foil structure 20b, and the core dielectric layer 10 are removed to expose the surfaces 132 of the insulation layers 130 and the conductive blocks 140c. Specifically, the first thin copper foil layer 24a and the second thin copper foil layer 24b are separated from the core dielectric layer 10, the first thick copper foil layer 22a, and the second thick copper foil layer 22b by peeling the first release layer 26a and the second release layer 26b. Then, an etching process is performed to etch the first thin copper foil layer 24a and the second thin copper foil layer 24b to expose the surfaces 132 of the insulation layers 130 and the conductive blocks 140c. It should be mentioned that, due to the adjustments of the etching process, the surfaces 142c of the conductive blocks 140c can be lower than or level with (not illustrated) the surfaces 132 of the insulation layers 130. At this point, the manufacture of the carrier substrate 100c is complete.

It should be mentioned that, the invention does not limit the number of the dielectric layer 110 and the conductive circuit layers (such as the second circuit layer 150b and the first circuit layer 120c). Although the dielectric layer 110 mentioned in FIG. 3F substantially only has one layer, however, the conductive circuit layer substantially has two layers (the first circuit layer 120c and the second circuit layer 150). However, in other unillustrated embodiments, after the step of FIG. 3D, that is, after forming the second circuit layers 150 on the dielectric layers 110, the steps of FIG. 3C to FIG. 3D can also be repeated once or a plurality of times to form a built-up structure, which still belongs to the usable technical solution of the invention and does not depart from the scope of the invention to be protected.

For instance, referring to FIG. 3F', the carrier substrate 100d of the present embodiment can further include a built-up structure 150'. Specifically, the built-up structure 150' is disposed on the surface 114 of the second circuit layer 150b and the dielectric layer 110. The built-up structure 150' includes at least one built-up dielectric layer 152 and a second conductive structure 154 disposed on the built-up dielectric layer 152, wherein the second conductive structure 154 at least includes a plurality of second conductive vias 154a disposed in the built-up dielectric layer 152 and a built-up circuit layer 154b disposed on a portion of the built-up dielectric layer 152, and a portion of the second conductive vias 154a connect with the second circuit layer 150b. The solder mask layer 160 is disposed on another portion of the outermost built-up dielectric layer 152 of the built-up structure 150' and covers a portion of the outermost second conductive structure 154, wherein the solder mask layer 160 has a plurality of second openings 162 exposing another portion of the second conductive structure 154.

In short, the carrier substrate 100d of the present embodiment has two dielectric layers (dielectric layer 110 and built-up dielectric layer 152) and three conductive circuit layers (first circuit layer 120c, second circuit layer 150b, and built-up circuit layer 154b). Here, the conductive blocks 140c filling the first openings 136 of the insulation layer 130 are suitable for electrically connecting, for instance, with a chip having smaller electrical linewidth/line distance (not illustrated), wherein conductive bumps (not illustrated) for connection are arranged on the chip. The built-up circuit layer 154b of the second conductive structure 154 exposed by the second openings 162 of the solder mask layer 160 can be viewed as a connection pad suitable for electrically connecting, for instance, with a printed circuit board having greater electrical spacing. In this way, the carrier substrate 100d of the present embodiment is suitable for carrying components of different electrical spacings.

Figure 4:
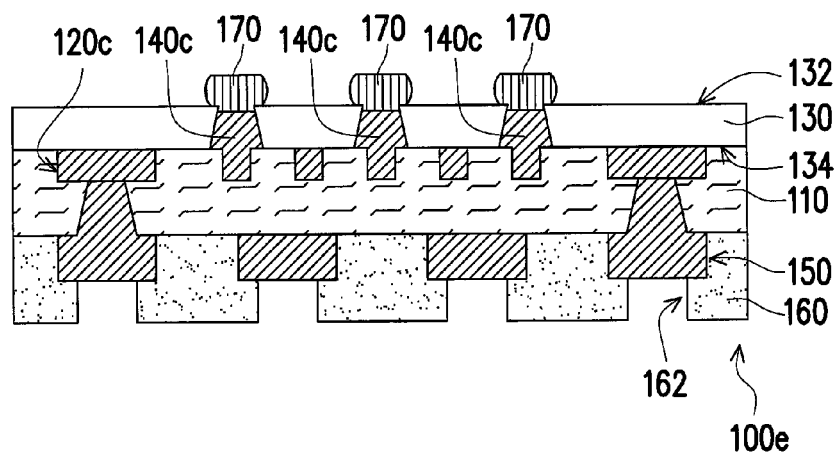
FIG. 4 illustrates a cross-sectional schematic diagram of a carrier substrate of an embodiment of the invention.

In other embodiments, referring to FIG. 4, after the step of FIG. 3F, that is, after removing the first copper foil structure 20a, the second copper foil structure 20b, and the core dielectric layer 10, a plurality of solder balls 170 can be respectively formed on the conductive blocks 140c, wherein the solder balls 170 respectively connect with the conductive blocks 140c to complete the manufacture of the carrier substrate 100e.

Alternately, referring to FIG. 4', after the step of FIG. 3F, that is, after removing the first copper foil structure 20a, the second copper foil structure 20b, and the core dielectric layer 10, a plurality of conductive bumps 180 can be respectively formed on the conductive blocks 140c, wherein the conductive bumps 180 respectively connect with the conductive blocks 140c and cover a portion of the insulation layer 130 to complete the manufacture of the carrier substrate 100f.

Alternately, referring to FIG. 4", after the step of FIG. 3F, that is, after removing the first copper foil structure 20a, the second copper foil structure 20b, and the core dielectric layer 10, a plurality of conductive towers 190 can be respectively formed on the conductive blocks 140c, wherein each conductive tower 190 has a tip face 192 and a base face 194 opposite to each other and the diameter of each conductive tower 190 is increased gradually from the tip face 192 to the base face 194. Then, a plurality of solder bumps 195 is respectively formed to cover the conductive towers 190 to complete the manufacture of the carrier substrate 100g.

Based on the above, the first openings of the insulation layer of the invention expose a portion of the first circuit layer and the conductive blocks are disposed on the first circuit layer exposed by the first openings. As a result, the conductive blocks can be used as a structure for elevating a portion of the first circuit layer. At the same time, the conductive blocks can be viewed as bonding pads for components. In this way, in subsequent applications of the carrier substrate of the invention in carrying components (such as capacitors, inductors, resistors, IC chips, or package), the component can be accurately connected with the conductive blocks to increase the reliability of bonding between the carrier substrate and the component. Moreover, the insulation layer covers another portion of the first circuit layer, which can protect the first circuit layer to prevent the generation of oxidation phenomenon so as to maintain the electrical performance of the first circuit layer.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A carrier substrate, comprising:
   a dielectric layer having a first surface and a second surface opposite to each other and a plurality of blind vias;
   a first circuit layer embedded in the first surface of the dielectric layer and having an upper surface and a lower surface opposite to each other, the upper surface exposed from the first surface of the dielectric layer, wherein the blind vias extend from the second surface to the first circuit layer and expose a portion of the lower surface of the first circuit layer;
   an insulation layer having a third surface and a fourth surface opposite to each other and disposed on the first surface of the dielectric layer through the fourth surface and covers a portion of the upper surface of the first circuit layer, the insulation layer having a plurality of first openings extending from the third surface to the fourth surface, wherein the first openings expose another portion of the upper surface of the first circuit layer, an aperture of each first opening is increased gradually from the third surface to the fourth surface, and the apertures of the first openings on the fourth surface are greater than a width of the exposed first circuit layer;

a plurality of conductive blocks respectively disposed in the first openings of the insulation layer and connected with another portion of the upper surface of the first circuit layer exposed by the first openings; and a first conductive structure disposed on the second surface of the dielectric layer and comprising a plurality of conductive vias filling the blind vias and a second circuit layer disposed on a portion of the second surface.

2. The carrier substrate as recited in claim 1, further comprising:

a built-up structure disposed on the second surface of the second circuit layer and the dielectric layer, the built-up structure comprising at least one built-up dielectric layer and a second conductive structure disposed on the built-up dielectric layer, wherein the second conductive structure at least comprises a plurality of second conductive vias disposed in the built-up dielectric layer and a built-up circuit layer disposed on a portion of the built-up dielectric layer, and a portion of the second conductive vias connect with the second circuit layer.

3. The carrier substrate as recited in claim 1, further comprising a plurality of conductive bumps disposed corresponding to the first openings of the insulation layer and respectively connecting with the conductive blocks.

4. The carrier substrate as recited in claim 1, further comprising:

a plurality of conductive towers respectively disposed on the conductive blocks, wherein each conductive tower has a tip face and a base face opposite to each other and a diameter of each conductive tower is increased gradually from the tip face to the base face.

* * * * *